(12) United States Patent
Ziqiang

(10) Patent No.: US 12,258,676 B2
(45) Date of Patent: Mar. 25, 2025

(54) PRE-HEAT RING AND SUBSTRATE PROCESSING DEVICE

(71) Applicant: JIANGSU ALPHA-SEMICONDUCTOR EQUIPMENT CO., LTD., Wuxi (CN)

(72) Inventor: Liu Ziqiang, Wuxi (CN)

(73) Assignee: Jiangsu Alpha-Semiconductor Equipment Co., Ltd., Wuxi (CN)

(*) Notice: Subject to any disclaimer, the term of this patent is extended or adjusted under 35 U.S.C. 154(b) by 0 days.

(21) Appl. No.: 18/012,639

(22) PCT Filed: Oct. 19, 2022

(86) PCT No.: PCT/CN2022/126189
§ 371 (c)(1),
(2) Date: Dec. 22, 2022

(87) PCT Pub. No.: WO2023/071886
PCT Pub. Date: May 4, 2023

(65) Prior Publication Data
US 2024/0102199 A1    Mar. 28, 2024

(30) Foreign Application Priority Data
Oct. 26, 2021    (CN) .......................... 202111249083.4

(51) Int. Cl.
*C30B 25/12* (2006.01)
*C30B 25/10* (2006.01)
*C30B 25/18* (2006.01)

(52) U.S. Cl.
CPC .............. *C30B 25/10* (2013.01); *C30B 25/12* (2013.01); *C30B 25/186* (2013.01)

(58) Field of Classification Search
CPC ........ C30B 25/10; C30B 25/12; C30B 25/186
See application file for complete search history.

(56) References Cited

U.S. PATENT DOCUMENTS

| 2012/0263875 A1* | 10/2012 | Brenninger | ......... C23C 16/4585 118/728 |
| 2015/0075430 A1* | 3/2015 | Shah | ....................... C30B 25/08 118/724 |

(Continued)

FOREIGN PATENT DOCUMENTS

| CN | 105765113 A | 7/2016 |
| CN | 108603290 A | 9/2018 |
| CN | 110494957 A | 11/2019 |

*Primary Examiner* — Matthew J Song
(74) *Attorney, Agent, or Firm* — Amster, Rothstein & Ebenstein LLP

(57) ABSTRACT

A pre-heat ring for a substrate processing device, which includes: a reaction chamber, a bearing disk, the pre-heat ring and a gas injection port. The bearing disk is arranged in the reaction chamber and supports a substrate; the pre-heat ring is arranged around the bearing disk; a supporting piece is arranged in the reaction chamber and supports the pre-heat ring; the gas injection port is formed in the reaction chamber and introduces a process gas; the pre-heat ring includes a ring body; the inner periphery and the outer periphery of the ring body each include a first section and a second section, the first section corresponds to the gas injection port, and the second section does not correspond to the gas injection port; and the first section of the outer periphery extends towards a gas injection port side.

17 Claims, 7 Drawing Sheets

(56) References Cited

U.S. PATENT DOCUMENTS

2018/0282865 A1\* 10/2018 Wang ...................... C30B 25/10
2019/0136376 A1\* 5/2019 Abedijaberi ...... H01J 37/32477
2020/0354853 A1\* 11/2020 Komori ................... H01L 21/02

\* cited by examiner

PRE-HEAT RING AND SUBSTRATE PROCESSING DEVICE

RELATED APPLICATIONS

This application is a U.S. national stage entry under 35 U.S.C. § 371 of PCT International Patent Application No. PCT/CN2022/126189, filed Oct. 19, 2022, which in turn claims priority to CN 202111249083.4, filed Oct. 26, 2021, the contents of which are incorporated herein by reference in their entirety.

FIELD OF TECHNOLOGY

The present invention relates to the technical field of semiconductor devices, and in particular to a pre-heat ring and a substrate processing device.

BACKGROUND

In the semiconductor manufacturing industry, chemical vapor deposition (CVD) is a well-known process for forming a thin film material on a silicon substrate (such as a silicon wafer). In the CVD process, gaseous molecules of a to-be-deposited material are provided to a wafer, so that a thin film of the material is formed on the wafer through chemical reaction. The formed thin film may be polycrystalline, amorphous or epitaxial. Generally, a CVD process is performed at high temperature, thereby accelerating chemical reaction and generating a high-quality thin film. Some processes, such as epitaxial silicon deposition, are performed at a very high temperature (>500° C., <1220° C.).

During the epitaxial process, a silicon substrate (such as wafer) is placed on a rotary graphite bearing disk in a reaction chamber, the substrate and the bearing disk are heated to a required temperature, and a reaction gas passes through the heated substrate, thereby epitaxially growing a thin layer of the required material on the substrate. Through subsequent processes, these deposited thin layers are made into integrated circuits, and tens of thousands to thousands or even millions of integrated circuit devices are generated according to the size of the substrate and the complexity of the circuits.

Reduced pressure epitaxy refers to a method for performing chemical vapor epitaxy in an environment below one atmospheric pressure, and has a very high requirement on the uniformity of a film-forming thickness. Various process parameters must be controlled accurately, thereby ensuring a high-quality deposited layer in reduced pressure epitaxy. A key parameter is a substrate temperature in each treating step. Since a deposition gas reacts at a specific temperature and is deposited on the substrate in the reduced pressure epitaxy process, the substrate temperature determines the deposition rate of a material on the substrate. If the temperature of the surface of the substrate changes, non-uniform deposition of the thin film will occur, and the physical property on the substrate will be non-uniform. In the reduced pressure epitaxial deposition, even slight non-uniform temperature distribution can lead to crystal face slip. How to accurately control the speed and temperature of the reaction gas passing through the surface of the wafer is a key to increase the yield of wafers.

In the prior art, in order to heat the process gas entering the reaction chamber to the process temperature as soon as possible, a pre-heat ring is arranged at the periphery of the bearing disk, so that the process gas is heated by the pre-heat ring in advance. However, due to an insufficient preheating distance for the process gas at the section of the pre-heat ring corresponding to the gas injection port of the reaction chamber, there is still problem that the process gas is not heated to a preset temperature, so that the temperature of the process at the section is less than the temperature at other sections, and a thin film is deposited at the section non-uniformly.

SUMMARY

An objective of the present invention is to provide a pre-heat ring and a substrate processing device, which can increase a pre-heat distance of a process gas entering a reaction chamber, thereby preventing the process gas from being heated insufficiently when the process gas first enters the reaction chamber and effectively ensuring that the temperature of the process gas on a surface of a substrate meets the process requirement.

To achieve the above objective, the present invention provides a pre-heat ring for a substrate processing device. The substrate processing device includes: a reaction chamber, a bearing disk, the pre-heat ring and a gas injection port; the bearing disk is arranged in the reaction chamber and used to supporting a substrate; the pre-heat ring is arranged around the bearing disk; a supporting piece is arranged in the reaction chamber and used to support the pre-heat ring; the gas injection port is formed in one side of the reaction chamber and used to introduce a process gas;

the pre-heat ring includes a ring body;

the ring body includes an inner periphery and an outer periphery;

the inner periphery and the outer periphery each include a first section and a second section, the first section is a section corresponding to the gas injection port, and the second section is the other section that does not correspond to the gas injection port; and the first section of the outer periphery includes an extending part formed by extending towards a gas injection port side in at least part of areas of the first section along a radial direction of the pre-heat ring.

Optionally, a supporting base in contact with the supporting piece is arranged on a bottom surface of the pre-heat ring; and the supporting base is a downward protrusion arranged on the bottom surface of the pre-heat ring and corresponding to the position of the supporting piece.

Optionally, the pre-heat ring is made of any one of silicon carbide and graphite coated with silicon carbide.

Optionally, a contour of the extending part in the outer periphery has any one or more of a continuous arc shape, a continuous wave shape and a continuous broken line shape.

Optionally, a first width is present between the outer periphery and the inner periphery of the second section of the ring body, and the first width is constant.

Optionally, the inner periphery is circular, and the area of the outer periphery in the second section is arc-shaped.

Optionally, the extending part is continuously distributed on all area of the first section of the outer periphery; a first width is present between the outer periphery and the inner periphery of the second section of the ring body, and the first width is constant; a second width is present between the outer periphery and the inner periphery of the first section of the ring body, and the second width is constant; and the second width is greater than the first width.

Optionally, the extending part is merely distributed on areas, corresponding to two sides or one side of the gas injection port, of the first section of the outer periphery.

Optionally, contours of areas of the extending part on the two sides or one side are trapezoidal."

Optionally, contours of areas of the extending part on the two sides or one side have a fin shape; the fin shape comprises a top, and an inner transition curve and an outer transition line which are located on two sides of the top; the outer transition line is located at a transition area between the first section and the second section, and the outer transition line extends along a gas flow direction; and a curvature of the inner transition curve gradually decreases towards an area away from the top.

Optionally, a thickness of the first section of the ring body is less than a thickness of the second section.

Optionally, a plurality of recessed parts are arranged on a bottom surface of the pre-heat ring.

Optionally, the plurality of recessed parts are distributed along a radial direction of the pre-heat ring.

Optionally, the plurality of recessed parts are distributed along a gas flow direction of the process gas.

Optionally, the recessed parts are long strip-shaped grooves or dotted grooves.

Optionally, the second section of the outer periphery also comprises an extending part in at least part of areas of the second section along a radial direction of the pre-heat ring.

Optionally, the first section accounts for ¼ to ⅓ of the pre-heat ring.

The present invention further provides a substrate processing device, including:
  a reaction chamber, a bearing disk, a pre-heat ring and a gas injection port;
  the bearing disk is arranged in the reaction chamber and used to support a substrate;
  the pre-heat ring is the pre-heat ring according to the present invention and is arranged around the bearing disk;
  a supporting piece is arranged on a side wall in the reaction chamber and used to support the pre-heat ring; and
  the gas injection port is formed in one side of the reaction chamber and used to introduce a process gas.

Compared with the prior art, the present invention has the following beneficial effects:
1) according to the present invention, the extending part is formed on the section, corresponding to the gas injection port, of the pre-heat ring, thereby increasing the pre-heat distance of the process gas entering the reaction chamber and preventing the process gas from being heated insufficiently when the process gas first enters the reaction chamber; and the pre-heat ring according to the present invention effectively ensures that the temperature of the process gas on the surface of the substrate meets the process requirement.
2) According to the present invention, the recessed parts are arranged at the bottom of the pre-heat ring, and the recessed parts have a smaller thickness, so the thermal resistance of the recessed parts is reduced; and the local temperature of the pre-heat ring is effectively controlled by controlling the distribution of the recessed parts.
3) The pre-heat ring according to the present invention has smaller thermal resistance and higher thermal conductivity, so the area outside the section of the pre-heat ring according to the present invention has a smaller width on the premise that the temperature of the process gas in the reaction chamber meets the process requirement, and the volume of the reaction chamber can be further reduced; and since the distance of the process gas passing through the reaction chamber is reduced, the time of the process gas pass through the reaction chamber is shortened, thereby greatly improving the production efficiency of wafers and saving the use amount of the gas.
4) According to the present invention, the weight of the pre-heat ring can be further reduced under the condition of ensuring the strength of the pre-heat ring, and the lightweight design of the reaction device is realized.
5) The pre-heat ring according to the present invention does not change the flow speed and flow direction of the introduced process gas, and the process flow in the reaction chamber is controllable.

BRIEF DESCRIPTION OF THE DRAWINGS

To describe the technical solutions in the embodiments of the present invention more clearly, the following briefly introduces the accompanying drawings required for the description. Apparently, the accompanying drawings in the following description are one embodiment of the present invention, those of ordinary skill in the art may still derive other drawings from these accompanying drawings without creative efforts.

DETAILED DESCRIPTION OF THE EMBODIMENTS

The following clearly and completely describes the technical solutions in the embodiments of the present invention with reference to accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

It should be noted that terms "including", "comprising", "having" or any other variants thereof are intended to cover non-exclusive inclusion, so that a process, method, article or terminal device including a series of elements not only includes those elements, but also includes other elements, or further includes elements inherent to such process, method, article or terminal device. In absence of more constraints, an element preceded by "including" or "comprising" does not preclude the existence of other elements in the process, method, article, or terminal device that includes the element.

It should be noted that the accompanying drawings all adopt very simplified forms and use inaccurate ratio, which are only used for conveniently and clearly assisting in describing the objective of the embodiment of the present invention.

Embodiment 1

Figure 1:
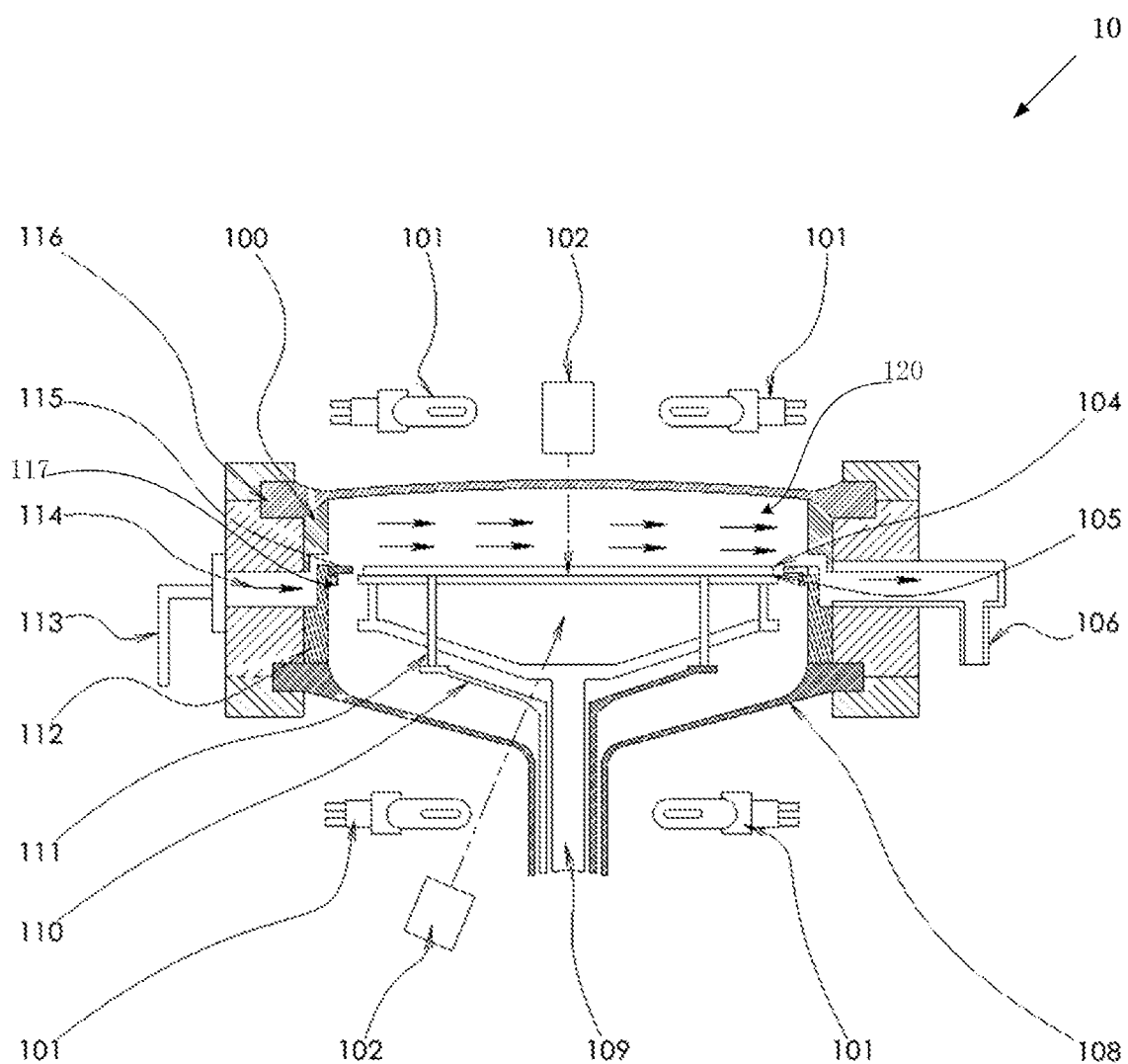
FIG. 1 is a schematic sectional view of a substrate processing device.

FIG. 1 is a schematic diagram of a cross section of a substrate processing device 10 according to the present invention.

The substrate processing device 10 includes a reaction chamber 120, a pre-heat ring 115, a bearing disk 105, a gas injection port 113 and a gas discharge port 106.

The reaction chamber 120 is used to deposit a thin film and/or grow a thin film on a substrate 104 (such as a silicon semiconductor wafer or a silicon-on-insulator (SOI) semiconductor wafer). The reaction chamber 120 is enclosed by a side wall, an upper quartz dome 116 and a lower quartz dome 108. The upper quartz dome 116 and the lower quartz dome 108 may be flat or have a roughly dome shape. The gas injection port 113 is formed at one end of the reaction chamber 120, and the gas discharge port 106 is formed at the other end, opposite to the gas injection port 113, of the reaction chamber 120. The side wall of the reaction chamber 120 further includes an upper liner 100 and a lower liner 112 which are located on an inner side, and is used to prevent a process gas 114 from reacting with an outer side (generally made of a metal material such as stainless steel) of the side wall of the reaction chamber. The upper liner 100 and the lower liner 112 may be made of a non-reactive material such as quartz.

In operation, the process gas 114 flows into the reaction chamber 120 through the gas injection port 113. Then, the process gas 114 flows above the surface of the substrate to deposit a film on the surface of the substrate 104. Finally, the process gas 114 flows out of the reaction chamber 120 through the gas discharge port 106.

The substrate 104 is supported by a bearing disk 105 in the reaction chamber 120. The bearing disk 105 is connected to a rotary supporting shaft 109, and drives the rotary supporting shaft 109 by an external motor (not shown in the figure) to rotate and move up and down so as to drive the bearing disk 105 and the substrate 104 to integrally rotate around a central axis of the rotary supporting shaft 109 or drive the bearing disk 105 to move up and down, thereby preventing excessive materials from being deposited on a front edge of the substrate and provide a more uniform epitaxial layer. A supporting pipe bracket 110 is used to support a pin shaft 111, and the pin shaft 111 may support the substrate 104 when transmitting the substrate 104.

The pre-heat ring 115 is arranged between the periphery of the bearing disk 105 and the liners 100 and 112 on the inner side of the side wall of the reaction chamber, and is used to heat the process gas 114 before the process gas 114 flowing into the reaction chamber 120 is in contact with the substrate 104. A supporting piece 117 is arranged on the lower liner 112 of the reaction chamber 120 and is used to support the pre-heat ring 115. As shown in FIG. 1, in the embodiment of the present invention, the supporting piece 117 may be an annular step or a plurality of protrusions (such as three protrusions, which only serves as an example and should not serve as a limitation) arranged on an inner side wall of the lower liner 112 along a circumferential direction of the lower liner 112.

Figure 2:
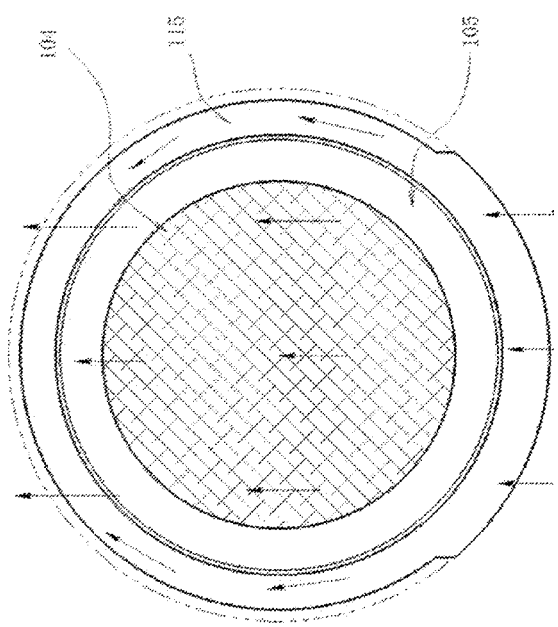
FIG. 2 is a schematic diagram of a surface flow field of a pre-heat ring, a substrate and a bearing disk according to an embodiment of the present invention.

FIG. 2 is a schematic diagram of a surface flow field of a pre-heat ring 115, a substrate 104 and a bearing disk 105 according to an embodiment of the present invention. The arrowhead in FIG. 2 indicates a flow field of the process gas 114 in the reaction chamber. The pre-heat ring 115 is arranged around the bearing disk 105, and a gap is present between the pre-heat ring 115 and the bearing disk 105 so as to allow the bearing disk 105 to rotate. The substrate 104 is placed on the bearing disk 105, and a diameter of the substrate 104 is less than a diameter of the bearing disk 105, thereby allowing the bearing disk 105 to heat the process gas 114 before the introduced process gas 114 is in contact with the substrate 104. When the introduced process gas 114 passes through the pre-heat ring 115 and the bearing disk 105, heat of the pre-heat ring 115 and the bearing disk 105 is transferred to the introduced processed gas 114 through heat transfer. Therefore, the introduced process gas 114 may be preheated by the pre-heat ring 115 and the bearing disk 105 before being in contact with the substrate 104.

The pre-heat ring 115 and the bearing disk 105 are usually opaque so as to absorb radiation heating light generated by infrared heating lamp groups 101 located above the reaction chamber 120 and below the reaction chamber 120. In the embodiment of the present invention, the pre-heat ring 115 and the bearing disk 105 may be made of any one of silicon carbide and graphite coated with silicon carbide. The infrared heating lamp groups 101 may be used to provide heat to the reaction chamber 120, so the pre-heat ring 115 and the bearing disk 105 are kept at a temperature higher than the ambient temperature, and the power of the infrared heating lamp groups 101 is controlled by a controller (not shown in the figure) based on a temperature obtained by an infrared thermometer 102. The shape and arrangement mode of the infrared heating lamp groups 101 in FIG. 1 only serve as an example, and should not serve as a limitation of the present invention. In order to ensure the uniform temperature in the reaction chamber or control the temperature of the local area in the reaction chamber, the present invention may use linear heating lamps with different lengths or non-linear special-shaped heating lamps, and the plurality of heating lamps may also be arranged in groups to form lamp arrays.

Figure 3:
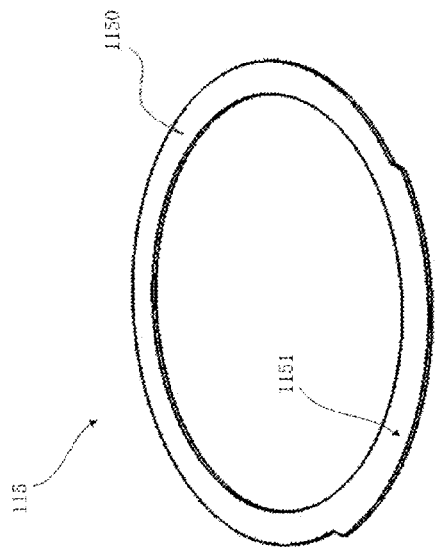
FIG. 3, FIG. 4 and FIG. 5 are schematic diagrams of various special-shaped structures of a pre-heat ring according to Embodiment 1 of the present invention.
Figure 4:
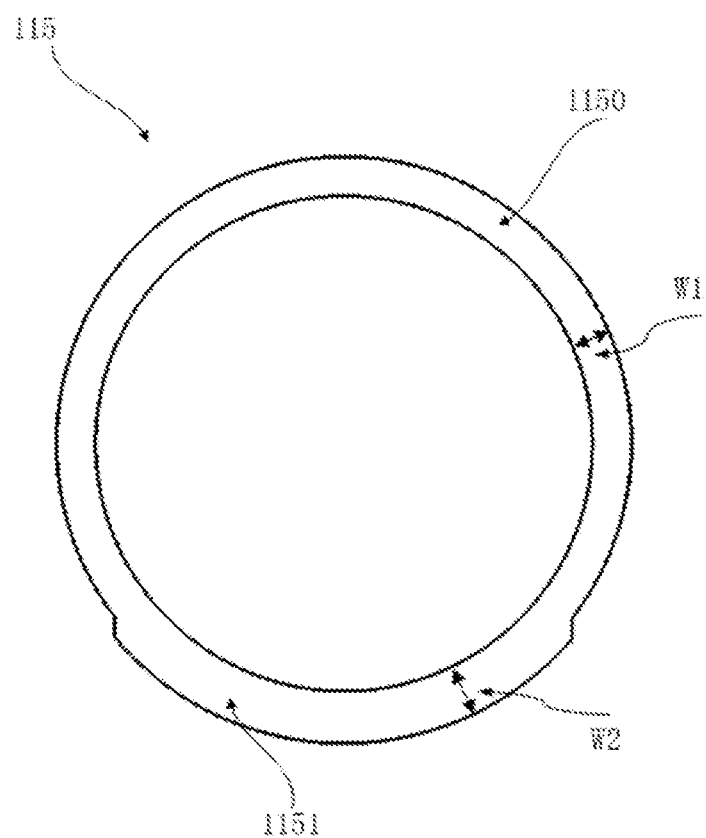

As shown in FIG. 3 and FIG. 4, the pre-heat ring 115 provided by the present invention includes a ring body 1150, and the ring body 1150 includes an inner periphery and an outer periphery. The inner periphery and the outer periphery each include a first section and a second section, the first section is a section corresponding to the gas injection port, and the second section is the other section that does not correspond to the gas injection port. It is easy to understand that the ring body 1150 is correspondingly divided into a first section of the ring body (corresponding to the gas injection port) and a second section of the ring body (not corresponding to the gas injection port). In the preferred embodiment of the present invention, the first section of the ring body accounts for ¼ to ⅓ of the ring body 1150.

As shown in FIG. 4, the inner periphery is circular, the second section of the outer periphery is arc-shaped, and the center of the inner periphery coincides with the center of the substrate 104 or the center of the bearing disk 105, so a gap between the inner periphery of the ring body 1150 and an outer edge of the substrate 104 is constant, thereby facilitating the uniform distribution of the temperature of the outer edge of the substrate 104. A first width W1 is present between the outer periphery and the inner periphery of the second section of the ring body (that is, between the second section of the inner periphery and the second section of the outer periphery). The first width W1 is a constant value on the second section. The constant first width is favorable for the uniform distribution of the temperature of the second section. The first section of the ring body includes an extending part 1151 formed by extending towards a gas injection port side in at least part of areas of the first section along a radial direction of the ring body 1150.

In this embodiment, the extending part 1151 is continuously distributed on all areas of the outer periphery of the first section. As shown in FIG. 3 and FIG. 4, a contour of the extending part 1151 in the outer periphery has a continuous arc shape, that is, the first section of the outer periphery is arc-shaped. A second width W2 is present between the outer periphery and the inner periphery of the first section of the ring body, the second width W2 is a constant value on the first section, and the second width W2 is greater than the first width W1 (a pre-heat distance of the process gas 114 entering the reaction chamber is increased).

It is easy to understand that according to the present invention, the extending part 1151 is formed on the section, corresponding to the gas injection port, of the pre-heat ring 115, thereby increasing the pre-heat distance of the process gas 114 entering the reaction chamber and preventing the process gas 114 from being heated insufficiently when the process gas 114 first enters the reaction chamber 120. The pre-heat ring 115 according to the present invention effectively can ensure that the temperature of the process gas 114 at the circumferential edge of the surface of the substrate meets the process requirement. Optionally, the second section of the outer periphery also comprises an extending part in at least part of areas of the second section along a radial direction of the pre-heat ring.

Figure 5:
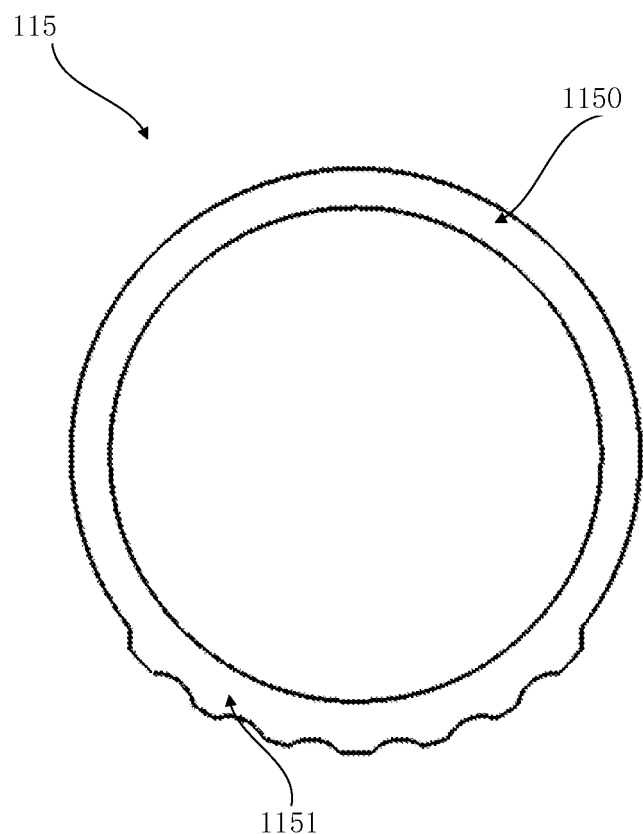

As shown in FIG. 5, in one embodiment of the present invention, the extending part 1151 is continuously distributed on all areas of the outer periphery of the first section of the ring body, and a contour of the extending part 1151 at the outer periphery has a continuous wave shape. In another embodiment, a contour of the extending part 1151 at the outer periphery has a continuous broken line shape. Or in yet another embodiment, a contour of the extending part 1151 at the outer periphery is formed by various combinations of a continuous arc shape, wave shape and broken line shape.

In this embodiment, in order to improve the heat-conducting efficiency of the first section of the ring body and realize that the thermal resistance of the first section of the ring body is less than the thermal resistance of the second section of the ring body, a thickness of the first section of the ring body may be less than a thickness of the second section of the ring body. The thickness of the first section of the ring body is reduced and the heat-conducting capability of the first section of the ring body is improved, so that the heating speed and the temperature of the first section of the ring body are higher than those of the second section of the ring body under the thermal radiation of the infrared heating lamp groups 101, and more preheated heat energy can be further provided for the introduced process gas 114. As another optional implementation manner, a material of the first section is different from a material of the second section, and the specific heat capacity of the material of the first section is less than the specific heat capacity of the material of the second section, so that the temperature of the first section is higher than the temperature of the second section.

Figure 6:
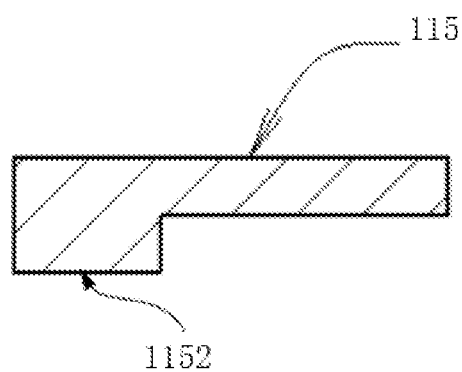
FIG. 6 is a schematic diagram of a supporting base of a pre-heat ring according to Embodiment 1 of the present invention.

In this embodiment, as shown in FIG. 6, the pre-heat ring 115 is further provided with a supporting base 1152 in contact with the supporting piece 117. The supporting base 1152 is a downward protrusion arranged on a bottom surface of the ring body 1150 and corresponding to the position of the supporting piece 117. Optionally, the protrusion may be shaped like a protruded point, for example, a plurality of protruded points uniformly distributed on the bottom surface of the pre-heat ring 115 in a circumferential direction. Optionally, the protrusion is an annular protrusion extending on the bottom surface along the circumferential direction of the pre-heat ring 115. By the design of the supporting base 1152, the thickness of other positions of the ring body 1150 is reduced, which is beneficial to improve the efficiency of heat conduction from heat radiation of the infrared heating lamp groups 101 to the pre-heat ring 115; meanwhile, by the design of the protrusion, the contact area between the ring body 1150 and the supporting piece 117 is reduced, heat loss caused by heat transfer from the pre-heat ring 115 to the side wall of the reaction chamber through the supporting piece 117 is effectively reduced, and it is ensured that the temperature of the pre-heat ring 115 meets the set requirement.

The dotted line in FIG. 2 indicates the reduced width through comparison between the pre-heat ring 115 provided by the present invention and the pre-heat ring in the prior art. Since the first section of the ring body of the pre-heat ring 115 provided by the present invention has smaller thermal resistance and higher heat conductivity, the second section of the ring body can have a smaller width on the premise that the temperature of the process gas 114 in the reaction chamber meets the process requirement, thereby further reducing the volume of the reaction chamber 120. Sine the distance of the process gas 114 passing through the reaction chamber is reduced, the time of the process gas 114 flowing through the reaction chamber 120 is shortened, thereby greatly improving the production efficiency of wafers. Meanwhile, according to the pre-heat ring 115 provided by the present invention, the weight of the pre-heat ring 115 can be further reduced under the condition of ensuring the strength, thereby realizing the lightweight design of the substrate processing device 10.

It should be further emphasized that according to the present invention, it is unnecessary to change the upper surface feature of the pre-heat ring 115 to increase the pre-heat area of the introduced process gas 114 on the pre-heat ring 115. For example, the upper surface feature may be a plurality of dotted, linear, arc-shaped and fin-shaped protruded parts arranged on the upper surface of the first section of the ring body. When the process gas 114 passes through the protruded parts, the original flow speed and flow direction will be inevitably changed, resulting in uncontrollable process in the reaction chamber. Therefore, the upper surface of the pre-heat ring 115 provided by the present invention is flat, which will not interfere with the introduced process gas 114 and will not form turbulent flow in the reaction chamber. The pre-heat ring 115 provided by the present invention will not interfere with the flow speed and flow direction of the process gas 114, thereby effectively ensuring that the substrate treating process conforms to the specification.

Embodiment 2

Figure 7:
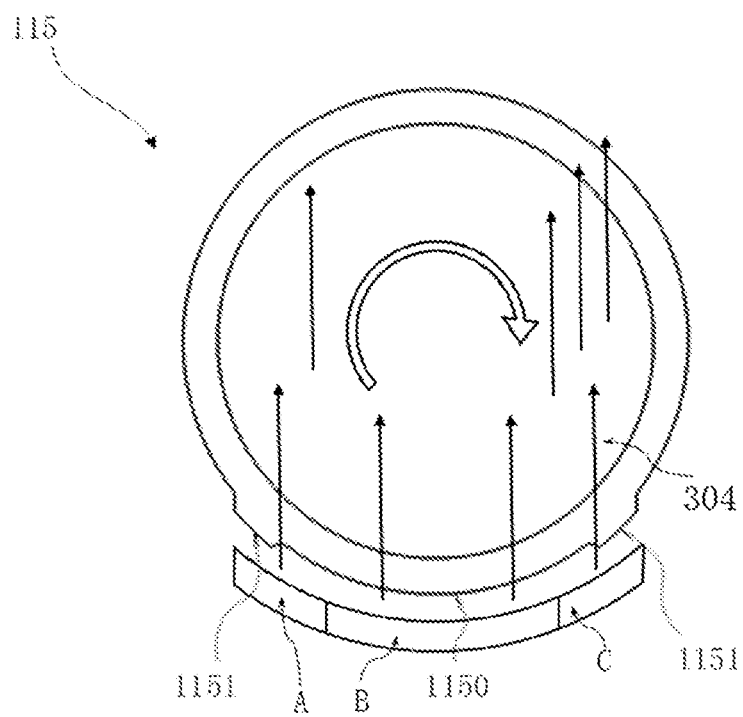
FIG. 7 and FIG. 8 are schematic diagrams of various special-shaped structures of a pre-heat ring according to Embodiment 2 of the present invention.

In this embodiment, the extending part 1151 is merely distributed on areas, corresponding to two sides or one side of a gas injection port, of a first section of an outer periphery. As shown in FIG. 7, contours of areas of the extending part 1151 on the two sides are trapezoidal. Specifically, the gas injection port is generally divided into different zones through inserting pieces, so that the flow of gas can be controlled in zones. Taking FIG. 7 as an example, the gas injection port is divided into three zones: a zone A, a zone B and a zone C, where the zone B is located in the middle of the gas injection port, and the zone A and the zone C are respectively located on two sides of the zone B. As the substrate will rotate during the process, FIG. 7 exemplarily shows the rotating direction of the substrate with an arc-shaped arrowhead. Assuming that the substrate rotates clockwise, the gas tends to accumulate on the right side of the substrate (based on the plane direction of paper where FIG. 7 is located) due to the influence of the rotation of the substrate on gas distribution. Such non-uniform gas distribution finally leads to the non-uniformity of the thin film deposited on the substrates in different areas. Therefore, the extending part 1151 is merely distributed at areas, corresponding to two sides or any one side of the gas injection port, of the first section of the outer periphery, that is, the extending part 1151 is only arranged at a position corresponding to the zone A or the zone C, which is beneficial to compensate for the influence of non-uniform gas distribution caused by the rotation of the substrate. Preferably, the extending part 1151 is only arranged at a position corresponding to the zone A, so that the temperature of the gas entering the left side of the substrate (based on the plane direction of paper where FIG. 7 is located) is increased, and the problem caused by gas accumulation on the right side due to the rotation of the substrate is compensated to a certain degree. Preferably, the extending parts 1151 are merely distributed on two sides, corresponding to the gas injection port, of the first section of the outer periphery. The two extending parts 1151 respectively located on two sides extend in different distances. The extension of the extending part 1151 on one side is farther than the extension of the extending part 1151 on the other side. The extending part 1151 extending farther may provide a longer time for pre-heat.

Figure 8:
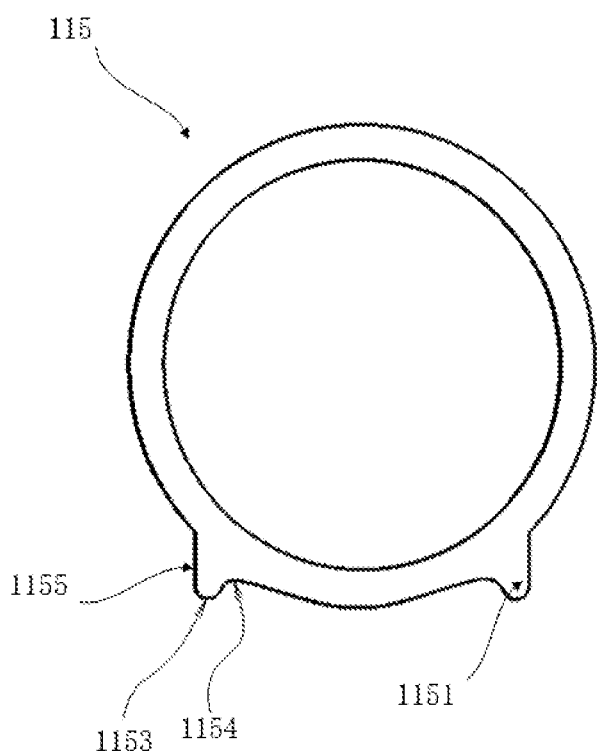

Preferably, as shown in FIG. 8, the extending part 1151 shown in FIG. 8 is different from the extending part 1151 in FIG. 7 only in shapes. Contours of the extending part 1151 on the areas of the two sides have a fin shape. The fin shape includes a top 1153, and an inner transition curve 1154 and an outer transition line 1155 which are located on two sides of the top. The outer transition line 1155 is located at a transition area between the first section and the second section of the outer periphery. The outer transition line 1155 extends along a gas flow direction 304 (as shown in FIG. 7). The curvature of the inner transition curve 1154 gradually decreases towards an area away from the top 1153. The outer transition line 1155 extends along the gas flow direction 304, thereby preventing the gas from being heated at a position outer side the gas injection port and improving the heating efficiency. The inner transition curve 1154 is beneficial to prevent the gas temperature from jumping in a circumferential direction. This is only an example. The number of the extending parts 1151 and the position of the extending part 1151 at the first section of the ring body may be set according to actual requirements.

Embodiment 3

Figure 9:
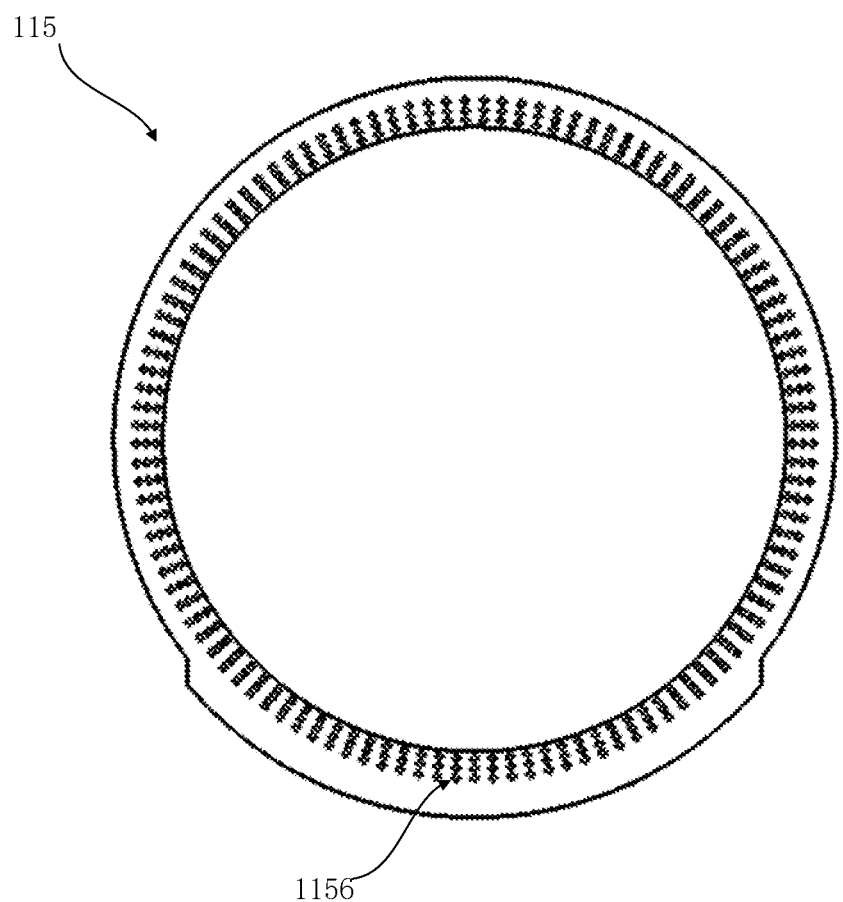
FIG. 9 is a bottom view of a pre-heat ring according to Embodiment 3 of the present invention.
Figure 10:
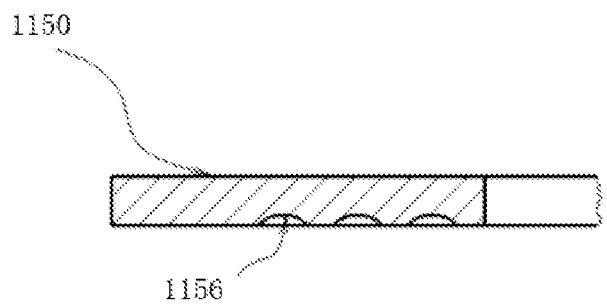
FIG. 10 a schematic radial sectional view of a pre-heat ring according to Embodiment 3 of the present invention.

In order to further improve the heat-conducting efficiency of the first section of the ring body, a thickness of the first section of the ring body is less than a thickness of the second section. Optionally, as shown in FIG. 9 and FIG. 10, according to the present invention, a plurality of recessed parts 1156 may be arranged on a bottom surface of the ring body. As the recessed parts 1156 have a smaller thickness, the thermal resistance of the pre-heat ring 115 at the corresponding positions of the recessed parts 1156 is reduced, and the heating efficiency of the first section of the ring body receiving thermal radiation is improved. As shown in FIG. 10, the recessed parts 1156 may be dotted grooves and have arc-shaped top surfaces to increase the area of the recessed parts 1156 receiving thermal radiation. The lightweight design of the pre-heat ring 115 is further realized through the recessed parts 1156. As shown in FIG. 10, in this embodiment, the plurality of recessed parts 1156 are distributed along a radial direction of the pre-heat ring 115.

In the present invention, a plurality of recessed parts 1156 may also be arranged at all or part of areas of the bottom of the second section of the ring body (may be distributed uniformly or non-uniformly). The plurality of recessed parts 1156 may also be distributed in groups. The local temperature of the pre-heat ring 115 is effectively controlled by controlling the distribution positions of the recessed parts 1156.

Embodiment 4

Figure 11:
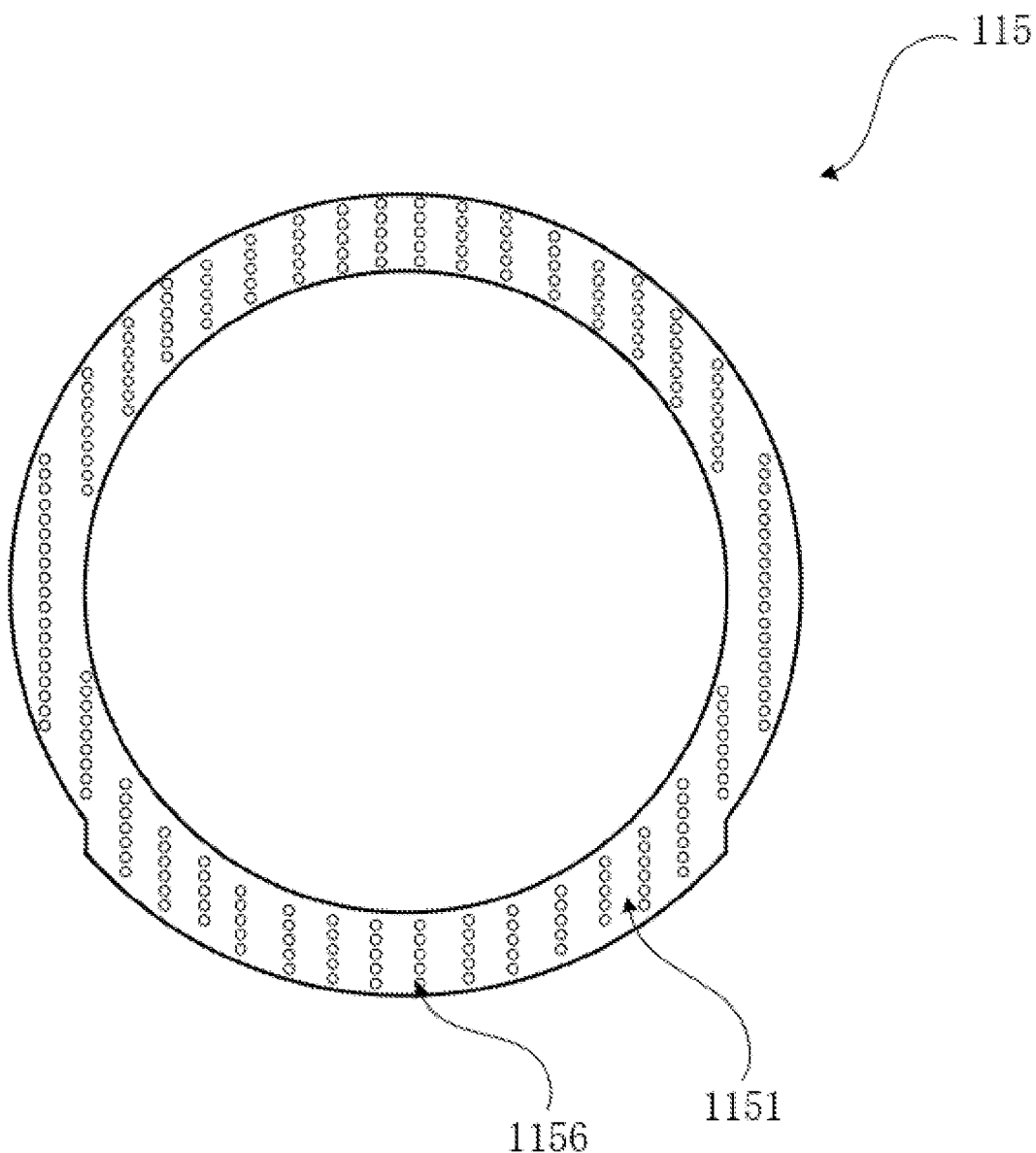
FIG. 11 is a bottom view of a pre-heat ring according to Embodiment 4 of the present invention.

As shown in FIG. 11, in this embodiment, a plurality of recessed parts 1156 are distributed along a gas flow direction of the processing gas 114. In other embodiments of the present invention, the recessed parts 1156 may also be long strip-shaped grooves, as long as the heat-conducting efficiency of the pre-heat ring 115 can be improved.

The present invention further provides a substrate processing device, including:
  a reaction chamber 120, a bearing disk 105, a pre-heat ring 115 and a gas injection port;
  the bearing disk 105 is arranged in the reaction chamber and used to support a substrate;
  the pre-heat ring 115 is the pre-heat ring 115 according to the present invention and is arranged around the bearing disk 105;
  a supporting piece is arranged on a side wall in the reaction chamber and used to support the pre-heat ring 115; and
  the gas injection port is formed in one side of the reaction chamber and used to introduce a process gas 114.

The above merely describes specific embodiments of the disclosure, but the protection scope of the disclosure is not limited thereto. Any person skilled in the art may easily conceive equivalent modifications or substitutions within the technical scope of the disclosure, and these modifications or substitutions shall fall within the protection scope of the disclosure. Therefore, the protection scope of the disclosure should be subject to the protection scope of the claims.

The invention claimed is:

1. A pre-heat ring for a substrate processing device, wherein the substrate processing device comprises: a reaction chamber, a bearing disk, the pre-heat ring and a gas injection port; the bearing disk is arranged in the reaction chamber and used to supporting a substrate; the pre-heat ring is arranged around the bearing disk; a supporting piece is arranged in the reaction chamber and used to support the pre-heat ring; the gas injection port is formed in one side of the reaction chamber and used to introduce a process gas;
  the pre-heat ring comprises a ring body;
  the ring body comprises an inner periphery and an outer periphery;
  the inner periphery and the outer periphery each comprise a first section and a second section, the first section is a section corresponding to the gas injection port, and the second section is the other section that does not correspond to the gas injection port; and the first section of the outer periphery comprises an extending part formed by extending towards a gas injection port side in at least part of areas of the first section along a radial direction of the pre-heat ring;

wherein a first width is present between the outer periphery and the inner periphery of the second section of the ring body, and the first width is constant;

the inner periphery is circular, and the center of the inner periphery coincides with the center of the bearing disk;

a second width is present between the outer periphery and the inner periphery of the first section of the ring body, and the second width is greater than the first width.

2. The pre-heat ring according to claim 1, wherein a supporting base in contact with the supporting piece is arranged on a bottom surface of the pre-heat ring; and the supporting base is a downward protrusion arranged on the bottom surface of the pre-heat ring and corresponding to the position of the supporting piece.

3. The pre-heat ring according to claim 1, wherein the pre-heat ring is made of any one of silicon carbide and graphite coated with silicon carbide.

4. The pre-heat ring according to claim 1, wherein a contour of the extending part in the outer periphery has any one or more of a continuous arc shape, a continuous wave shape and a continuous broken line shape.

5. The pre-heat ring according to claim 1, wherein the area of the outer periphery in the second section is arc-shaped.

6. The pre-heat ring according to claim 1, wherein the extending part is continuously distributed on all area of the first section of the outer periphery; and the second width is constant.

7. The pre-heat ring according to claim 1, wherein the extending part is merely distributed on areas, corresponding to two sides or one side of the gas injection port, of the first section of the outer periphery.

8. The pre-heat ring according to claim 7, wherein contours of areas of the extending part on the two sides or one side are trapezoidal.

9. The pre-heat ring according to claim 7, wherein contours of areas of the extending part on the two sides or one side have a fin shape; the fin shape comprises a top, and an inner transition curve and an outer transition line which are located on two sides of the top;

the outer transition line is located at a transition area between the first section and the second section, and the outer transition line extends along a gas flow direction; and a curvature of the inner transition curve gradually decreases towards an area away from the top.

10. The pre-heat ring according to claim 1, wherein a thickness of the first section of the ring body is less than a thickness of the second section.

11. The pre-heat ring according to claim 1, wherein a plurality of recessed parts are arranged on a bottom surface of the pre-heat ring.

12. The pre-heat ring according to claim 11, wherein the plurality of recessed parts are distributed along a radial direction of the pre-heat ring.

13. The method according to claim 11, wherein the plurality of recessed parts are distributed along a gas flow direction of the process gas.

14. The pre-heat ring according to claim 13, wherein the recessed parts are long strip-shaped grooves or dotted grooves.

15. The pre-heat ring according to claim 1, the second section of the outer periphery also comprises an extending part in at least part of areas of the second section along a radial direction of the pre-heat ring.

16. The pre-heat ring according to claim 1, wherein the first section accounts for ¼ to ⅓ of the pre-heat ring.

17. A substrate processing device, comprising:
a reaction chamber, a bearing disk, a pre-heat ring and a gas injection port,
wherein the bearing disk is arranged in the reaction chamber and used to support a substrate;
the pre-heat ring is the pre-heat ring according to claim 1 and is arranged around the bearing disk;
a supporting piece is arranged on a side wall in the reaction chamber and used to support the pre-heat ring; and
the gas injection port is formed in one side of the reaction chamber and used to introduce a process gas.

* * * * *